US012593736B2

(12) United States Patent
Baek et al.

(10) Patent No.: US 12,593,736 B2
(45) Date of Patent: Mar. 31, 2026

(54) POWER MODULE PACKAGE WITH STACKED DIRECT BONDED METAL SUBSTRATES

(71) Applicant: SEMICONDUCTOR COMPONENTS INDUSTRIES, LLC, Phoenix, AZ (US)

(72) Inventors: Jonghwan Baek, Bucheon (KR); Jeonghyuk Park, Incheon (KR); Seungwon Im, Seoul (KR); Keunhyuk Lee, Suzhou (CN); Dukyong Lee, Bucheon (KR)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 740 days.

(21) Appl. No.: 17/931,665

(22) Filed: Sep. 13, 2022

(65) Prior Publication Data

US 2024/0088007 A1     Mar. 14, 2024

(51) Int. Cl.
| | |
|---|---|
| *H01L 23/498* | (2006.01) |
| *H01L 21/48* | (2006.01) |
| *H01L 23/00* | (2006.01) |
| *H01L 25/00* | (2006.01) |
| *H01L 25/16* | (2023.01) |

(52) U.S. Cl.
CPC .... *H01L 23/49833* (2013.01); *H01L 21/4825* (2013.01); *H01L 21/4839* (2013.01); *H01L 23/49811* (2013.01); *H01L 23/49822* (2013.01); *H01L 23/49844* (2013.01); *H01L 23/49861* (2013.01); *H01L 24/32* (2013.01);

*H01L 24/48* (2013.01); *H01L 24/73* (2013.01); *H01L 25/162* (2013.01); *H01L 25/50* (2013.01); *H01L 2224/32225* (2013.01); *H01L 2224/48139* (2013.01); *H01L 2224/48145* (2013.01); *H01L 2224/48175* (2013.01); *H01L 2224/48225* (2013.01); *H01L 2224/73265* (2013.01); *H01L 2924/12036* (2013.01); *H01L 2924/13055* (2013.01)

(58) Field of Classification Search
CPC ............. H01L 23/3775; H01L 23/3121; H01L 23/49833; H01L 2224/48145
See application file for complete search history.

(56) References Cited

U.S. PATENT DOCUMENTS

| | | | | | |
|---|---|---|---|---|---|
| 7,723,833 | B2 * | 5/2010 | Mehta | ................. | H01L 25/0657 438/109 |
| 8,604,611 | B2 * | 12/2013 | Hauenstein | ........... | H01L 25/072 257/723 |
| 9,704,819 | B1 * | 7/2017 | Gao | ..................... | H01L 21/563 |

(Continued)

*Primary Examiner* — Dale E Page
*Assistant Examiner* — Rohit Parthasarathy
(74) *Attorney, Agent, or Firm* — Brake Hughes Bellermann LLP

(57) ABSTRACT

A package includes a first direct bonded metal (DBM) substrate, a first semiconductor die disposed on a top surface of the first DBM substrate, a second DBM substrate disposed at a height above the first DBM substrate, and a second semiconductor die disposed on a top surface of the second DBM substrate. A wire bond is made between the first semiconductor die disposed on the top surface of the first DBM substrate and the second semiconductor die disposed on the top surface of the second DBM substrate.

19 Claims, 12 Drawing Sheets

(56)                References Cited

U.S. PATENT DOCUMENTS

|  |  |  |  |  |
|---|---|---|---|---|
| 9,818,686 | B2 * | 11/2017 | Wu | H01L 25/074 |
| 9,986,631 | B2 * | 5/2018 | Rizza | H01L 24/33 |
| 10,141,254 | B1 * | 11/2018 | Xu | H01L 25/18 |
| 10,700,035 | B2 * | 6/2020 | Tuominen | H01L 24/19 |
| 10,804,209 | B2 * | 10/2020 | Kang | H01L 24/09 |
| 10,991,670 | B2 * | 4/2021 | Liu | H01L 23/49537 |
| 11,075,137 | B2 * | 7/2021 | Lin | H01L 23/3135 |
| 11,462,504 | B2 * | 10/2022 | Tokubo | H01L 23/49575 |
| 11,557,571 | B2 * | 1/2023 | Park | H01L 25/18 |
| 2007/0132081 | A1 * | 6/2007 | Wang | H01L 25/0657 |
|  |  |  |  | 257/E23.085 |
| 2010/0270667 | A1 * | 10/2010 | Tong | H01L 25/0652 |
|  |  |  |  | 257/E21.705 |
| 2013/0056882 | A1 * | 3/2013 | Kim | H01L 25/0657 |
|  |  |  |  | 257/E23.141 |
| 2013/0098867 | A1 * | 4/2013 | Wei | C04B 37/026 |
|  |  |  |  | 216/41 |
| 2013/0147540 | A1 * | 6/2013 | Wu | H10D 84/84 |
|  |  |  |  | 257/195 |
| 2013/0328200 | A1 * | 12/2013 | Bae | H01L 23/49833 |
|  |  |  |  | 257/762 |
| 2014/0152373 | A1 * | 6/2014 | Romas, Jr. | H01L 25/18 |
|  |  |  |  | 327/374 |
| 2016/0225693 | A1 * | 8/2016 | Tolentino | H01L 25/0652 |
| 2018/0153030 | A1 * | 5/2018 | Viswanathan | H01L 23/15 |
| 2020/0066647 | A1 * | 2/2020 | Shiizaki | H01L 23/49575 |
| 2020/0168529 | A1 * | 5/2020 | St. Germain | H01L 23/64 |
| 2020/0286866 | A1 * | 9/2020 | Kawashima | H01L 25/072 |
| 2021/0125904 | A1 * | 4/2021 | Sugimachi | H01L 23/49548 |
| 2022/0149010 | A1 * | 5/2022 | Kyung | H01L 25/0657 |
| 2022/0208654 | A1 * | 6/2022 | Baek | H01L 23/49551 |
| 2023/0253362 | A1 * | 8/2023 | Im | H01L 23/49531 |
|  |  |  |  | 257/666 |

* cited by examiner

300

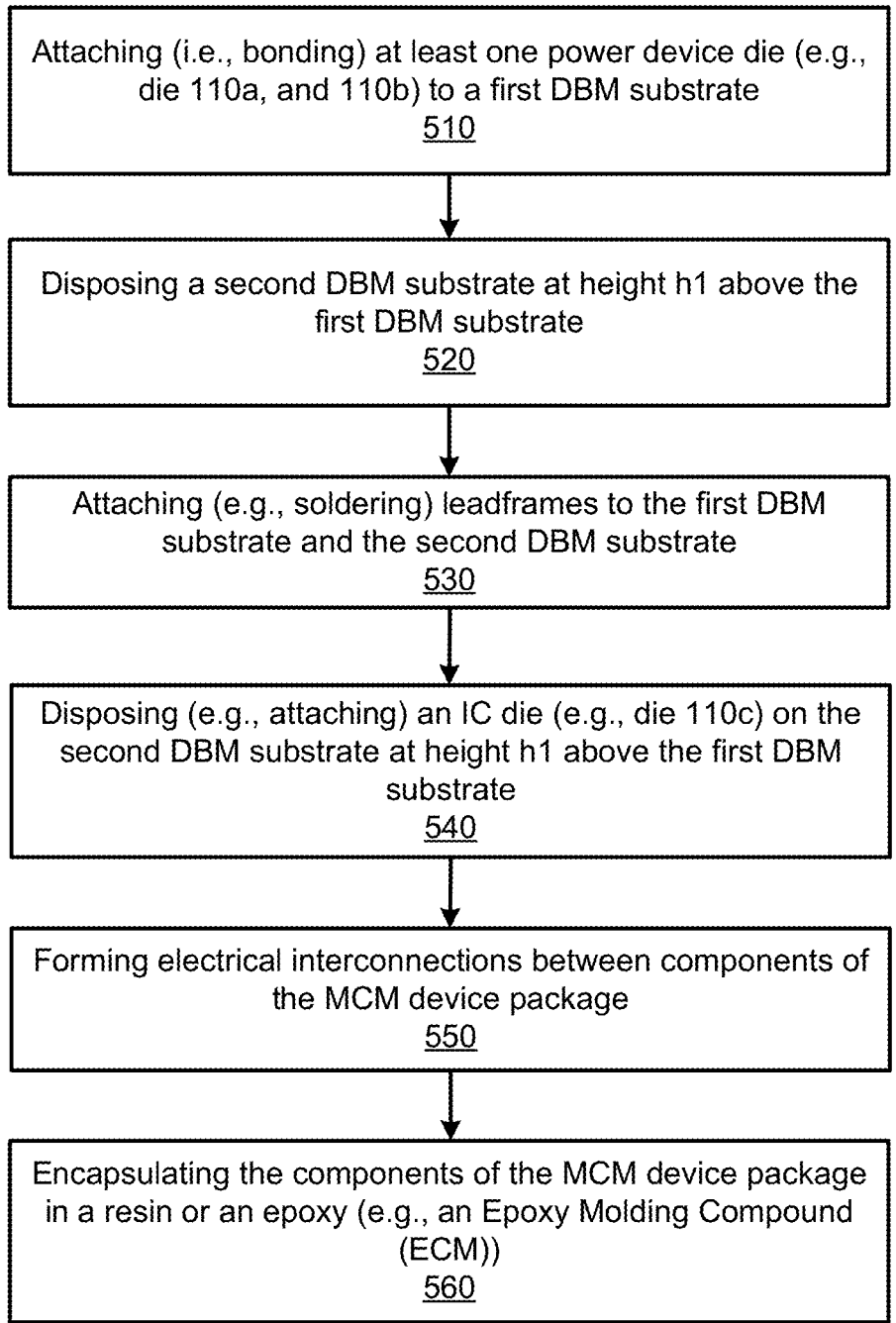

Attaching (i.e., bonding) at least one power device die (e.g., die 110a, and 110b) to a first DBM substrate
510

Disposing a second DBM substrate at height h1 above the first DBM substrate
520

Attaching (e.g., soldering) leadframes to the first DBM substrate and the second DBM substrate
530

Disposing (e.g., attaching) an IC die (e.g., die 110c) on the second DBM substrate at height h1 above the first DBM substrate
540

Forming electrical interconnections between components of the MCM device package
550

Encapsulating the components of the MCM device package in a resin or an epoxy (e.g., an Epoxy Molding Compound (ECM))
560

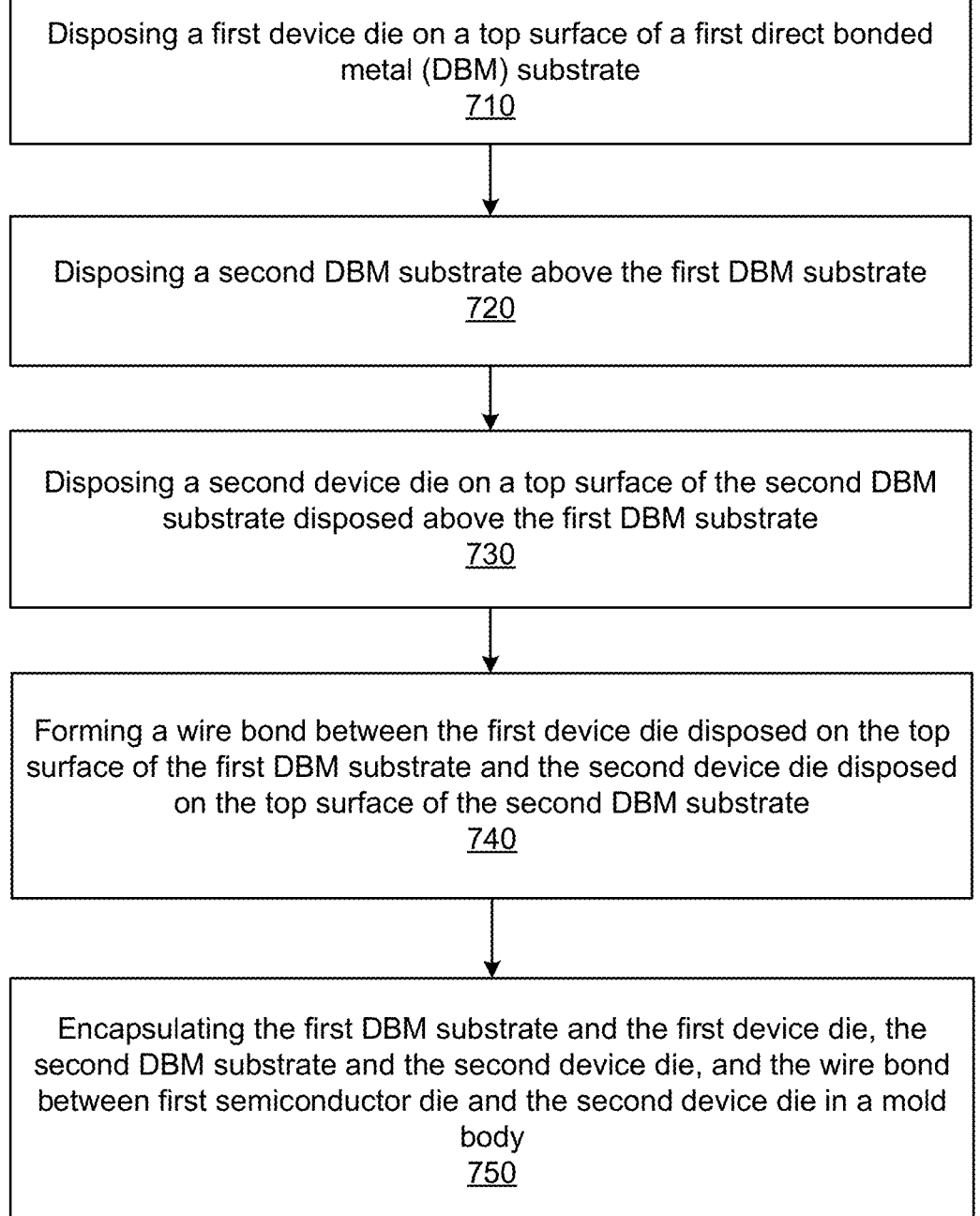

Disposing a first device die on a top surface of a first direct bonded metal (DBM) substrate
710

Disposing a second DBM substrate above the first DBM substrate
720

Disposing a second device die on a top surface of the second DBM substrate disposed above the first DBM substrate
730

Forming a wire bond between the first device die disposed on the top surface of the first DBM substrate and the second device die disposed on the top surface of the second DBM substrate
740

Encapsulating the first DBM substrate and the first device die, the second DBM substrate and the second device die, and the wire bond between first semiconductor die and the second device die in a mold body
750

POWER MODULE PACKAGE WITH STACKED DIRECT BONDED METAL SUBSTRATES

TECHNICAL FIELD

This description relates to packaging of semiconductor die in high-power device packages.

BACKGROUND

Modern high-power devices (e.g., power devices such as an insulated-gate bipolar transistor (IGBT), a fast recovery diode (FRD), etc.) are fabricated in semiconductor die. High-power devices that can deliver or switch high levels of power can be used in, for example, vehicles powered by electricity (e.g., Electric vehicles (EVs), hybrid electric vehicles (HEVs) and plug-in-electric vehicles (PHEV)). The power devices can be fabricated in semiconductor die. The high-power devices may be packaged in single-side cooling (SSC) or dual-side cooling (DSC) power modules. Semiconductor die can be encapsulated in the SSC or the DSC power modules in a supporting material that prevents physical damage and corrosion during the packaging processes.

SUMMARY

In a general aspect, a package includes a first direct bonded metal (DBM) substrate, a first semiconductor die disposed on a top surface of the first DBM substrate, a second DBM substrate disposed at a height above the first DBM substrate, and a second semiconductor die disposed on a top surface of the second DBM substrate. The package further includes a wire bond made between the first semiconductor die disposed on the top surface of the first DBM substrate and the second semiconductor die disposed on the top surface of the second DBM substrate.

In a general aspect, a package includes a stack of direct bonded metal (DBM) substrates including at least a first DBM substrate and a second DBM substrate disposed above the first DBM substrate. The package further includes a multiplicity of semiconductor die disposed on the stack of the DBM substrates including a first semiconductor die disposed on the first DBM substrate and a second semiconductor die disposed on the second DBM substrate, and a wire bond between the first semiconductor die disposed on the first DBM substrate and the second semiconductor die disposed on the second DBM substrate.

In a general aspect, a method includes disposing a first device die on a top surface of a first direct bonded metal (DBM) substrate and disposing a second DBM substrate above the first DBM substrate. The method further includes disposing a second device die on a top surface of the second DBM substrate disposed above the first DBM substrate, and forming a wire bond between the first device die disposed on the top surface of the first DBM substrate and the second device die disposed on the top surface of the second DBM substrate.

The details of one or more implementations are set forth in the accompanying drawings and the description below. Other features will be apparent from the description and drawings, and from the claims.

BRIEF DESCRIPTION OF THE DRAWINGS

FIG. 5 illustrates an example method for fabricating a multi-chip module (MCM) package.

FIG. 7 illustrates an example method for fabricating a multi-chip module (MCM) package.

DETAILED DESCRIPTION

Figure 1:
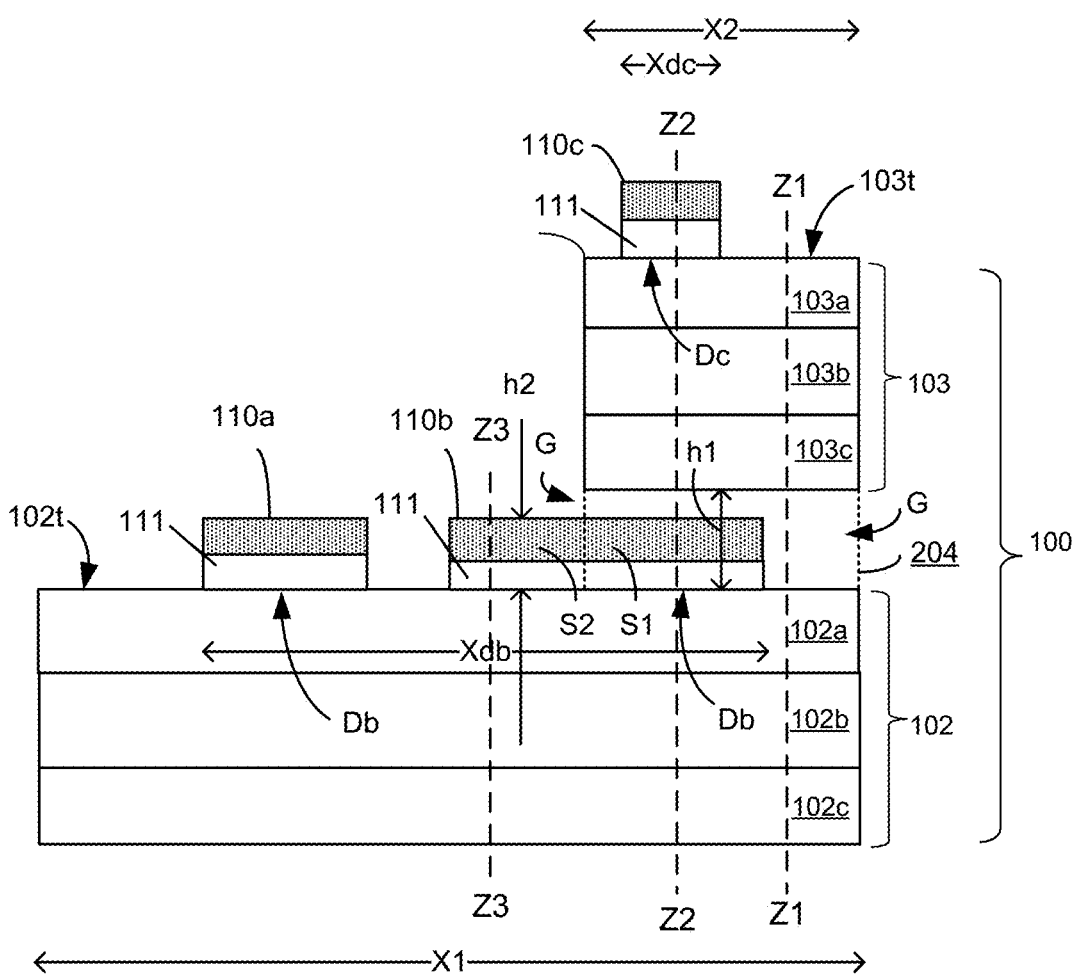
FIG. 1 illustrates, in cross sectional view, an example vertical stack of two direct bonded metal (DBM) substrates.

Semiconductor die can be packaged in a power module for use, for example, in automotive applications. In a power module, the semiconductor die can be mechanically attached or bonded to a top surface of a direct bonded metal (DBM) (e.g., direct-bonded copper (DBC)) substrate. The DBM substrate can include an insulating dielectric layer (e.g., a ceramic tile) disposed between two metal layers. The DBM substrate can have a designated area (die attach pad (DAP)) on its top surface to which the semiconductor die can be attached or bonded. A size of a single semiconductor die that can be attached to a DBM substrate can be limited by a size of a corresponding DAP available on the DBM substrate.

A DBM substrate, used in the power modules as described herein, can be composed of a ceramic tile (e.g., alumina $(Al_2O_3)$, zirconia-toughened-alumina (ZTA), aluminum nitride (AlN), beryllium oxide (BeO), etc.) with a planar sheet of metal (e.g., copper) bonded to one or both sides of the ceramic tile. One or more of the metal layers can be patterned and/or can be used for electrical traces or contacts. For example, device contact pads on the semiconductor die can be coupled (e.g., bonded) to a corresponding conductive metal trace pattern (e.g., printed circuit traces) on a side of the DBM substrate using, for example, adhesive joints (e.g., solder balls, solder pads, sintered material, etc.). The adhesive joints provide continuity of electrical and thermal flow paths from device contacts (e.g., device terminals) on the semiconductor die through the conductive metal trace pattern of the DBM substrate. Each adhesive joint may, for example, provide an electrical connection for a respective specific I/O function of the semiconductor die. Mechanical and structural integrity of the adhesive joints can be important for proper electrical functioning of the power module.

The DBM substrates described herein can be used in a power device package that can be a device package for connecting the semiconductor die to the external environment via leads such as lands, balls, or pins. The package may provide protection against threats such as mechanical impact, chemical contamination, and light exposure. Additionally, the package may help dissipate heat produced by the semiconductor die.

A multi-chip module (MCM) device package can include multiple semiconductor die (e.g., an IGBT die, a FRD die, a power device die, an integrated controller chip (IC) die, etc.) that are integrated so that, in use, the MCM device package can be treated as if it were a single component. The multiple semiconductor die can be attached to DAPs on a single DBM substrate. A size of the single DBM substrate can correspond to a footprint (in other words, a cross-sectional area in an x-y plane parallel to the DBM substrate) of the MCM device package. Inclusion of a semiconductor dies (or dies) (e.g., a power device die) having a large size in the MCM device package requires inclusion of correspondingly a large size DBM substrate and can result a large footprint MCM device package.

An existing device package design may have a fixed size (e.g., lateral size or footprint) determined, for example, by a configuration of pins, lead frames, connectors, etc., that can be used to couple the device package to a circuit board or other system components for a user application. The limited sizes of the existing device package designs can limit DAP sizes and the sizes of the semiconductor die that can be included in the fixed-size MCM device package. For modern high current products, the semiconductor die sizes can be larger than can be fitted in the existing package designs. Increasing the package sizes to accommodate the large-size semiconductor die for the modern high current products can be expensive and result in MCM device packages having sizes that are difficult to integrate in systems of use.

A MCM device package includes a vertical stack of at least two DBM substrates on which semiconductor dies of the device package are disposed, in accordance with the principles of the present disclosure.

The MCM device package may have a limited package size (e.g., a limited footprint size) and have a maximized current rating for the package size. The vertical stack of the at least two DBM substrates included in the MCM device package can increase a total area of DAPs available for attaching the semiconductor die (within a fixed cross-sectional or footprint size of the MCM device package) by reserving one of the at least two DBM substrates in the vertical stack included in the MCM device package for power die DAP, and the other of the at least two DBM substrates for IC die DAP.

In example implementations, the semiconductor dies included in the MCM device package may include a first semiconductor die (e.g., power die, an IGBT) and a second semiconductor die (e.g., an integrated circuit (IC) controller die). The vertical stack of at least two DBM substrates may, for example, include a first DBM substrate on which the power die is disposed and a second DBM substrate on which the IC die is disposed. The second DBM substrate may be disposed vertically above the power die disposed on the first DBM substrate. The second DBM substrate may be attached to the first DBM substrate to form, for example, a shelf or overhang vertically above the power die disposed on first DBM substrate. The power die may have large size (e.g., length) such that the shelf or overhang formed by the second DBM substrate may extend over only a portion of the length for the power die)

Figure 3A:
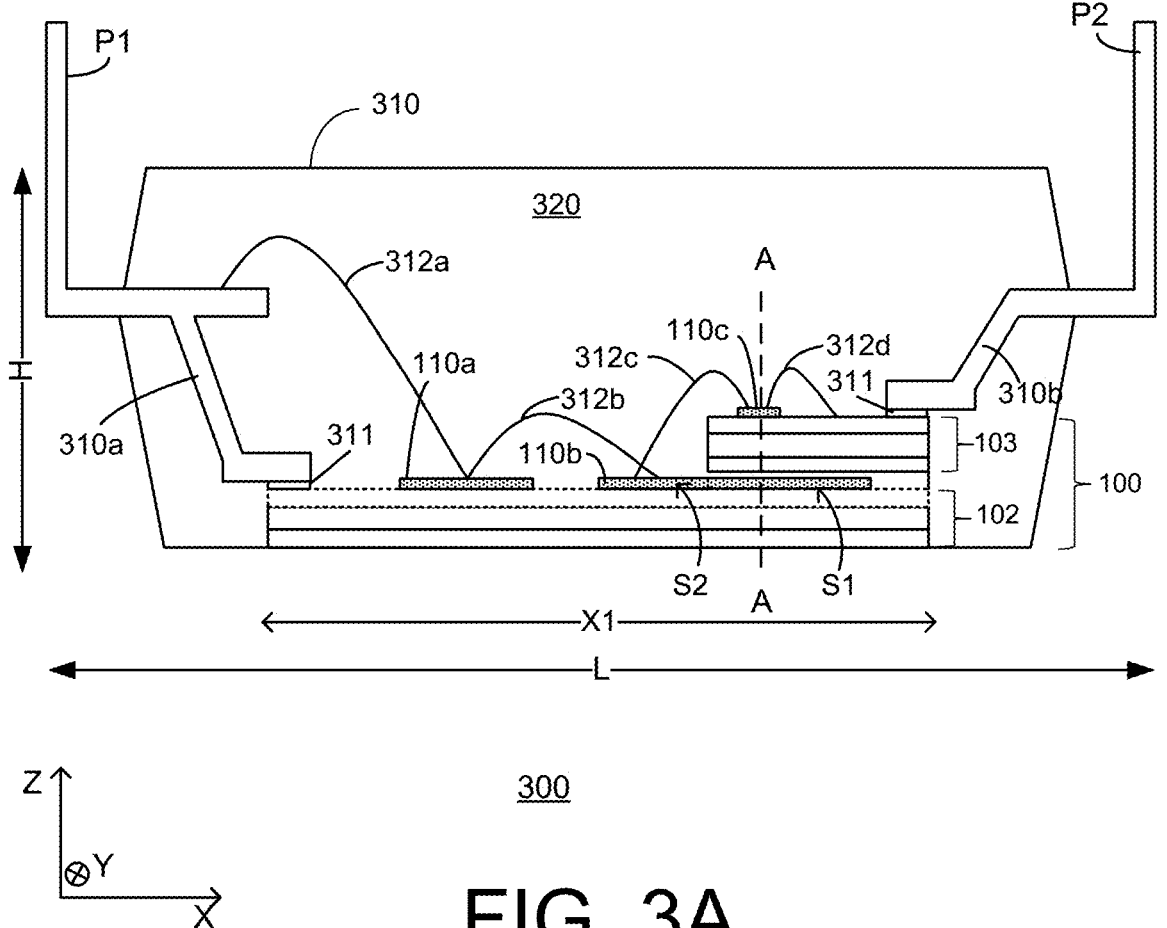
FIGS. 3A and 3B illustrate, in cross-sectional views, an example multi-chip module (MCM) device package in which multiple semiconductor die are disposed on a vertical stack of substrates.

FIG. 1 shows, in cross sectional view, an example vertical stack 100 of two DBM substrates that can be used to support semiconductor dies in a MCM device package (e.g., MCM device package 300, FIG. 3A).

Vertical stack 100 may include a first DBM substrate (e.g., DBM substrate 102) and a second DBM substrate (DBM substrate 103) that is vertically stacked above (e.g., in a z direction) the first DBM substrate.

DBM substrate 102 and DBM substrate 103 may each include a ceramic tile (e.g., tile 102b, tile 103b) that have planar sheets of metal (e.g., metal sheets 102a, 102c, 103a, 103c) bonded to both sides of the ceramic tile. In example implementations, the planar sheets of metal may be made of copper or copper alloy and may be patterned to form conductive traces and pads on a side or both sides of the ceramic tile.

The first DBM substrate (e.g., DBM substrate 102) may, for example, have a length X1 (e.g., in a x direction) and a width Y1 (not shown in FIG. 1) in the Y direction (perpendicular to the page of FIG. 1). Length X1 and width Y1 may, for example, each be in a range of a few millimeters to tens of millimeters. An example first DBM substrate may, for example, have X-Y dimensions of about X1=18 mm and Y1=30 mm.

The second DBM substrate (e.g., DBM substrate 103) may, for example, have a length X2 (e.g., in a x direction) and a width Y2 (not shown in FIG. 1, but shown e.g., in FIGS. 2A, 2B and 4) in the Y direction (perpendicular to the page of FIG. 1). The length X2 of the second substrate can be smaller than length X1 of the first DBM substrate, while the width Y2 of the second substrate may be about the same as, or comparable to, the width Y1 of the first DBM substrate. For example, for the example first DBM substrate having X-Y dimensions of about X1=18 mm and Y1=30 mm, the second DBM substrate may have X-Y dimensions of about X2=5 mm and Y2=30 mm.

In vertical stack 100, the second DBM substrate (DBM substrate 103) may, for example, form a ledge (having a depth or length in the x direction of about X2) overhanging a portion of a top surface (e.g., top surface 102t) of the first DBM substrate at a height h1 (in the z direction). The second DBM substrate may be attached to the first DBM substrate, for example, by a spacer layer (e.g., spacer layer 204, FIG. 2) having a thickness h1. The spacer layer may include adhesive material (e.g., a resin, an epoxy, or a molding compound, etc.) or can include a metal block, disposed at an edge (e.g., edge E, FIG. 2) of the second DBM substrate. The spacer layer (e.g., spacer layer 204) may have a vertical height h1 (in the z direction) resulting in a gap G of height h1 between the first DBM substrate and the overhanging second DBM substrate.

Figure 4:
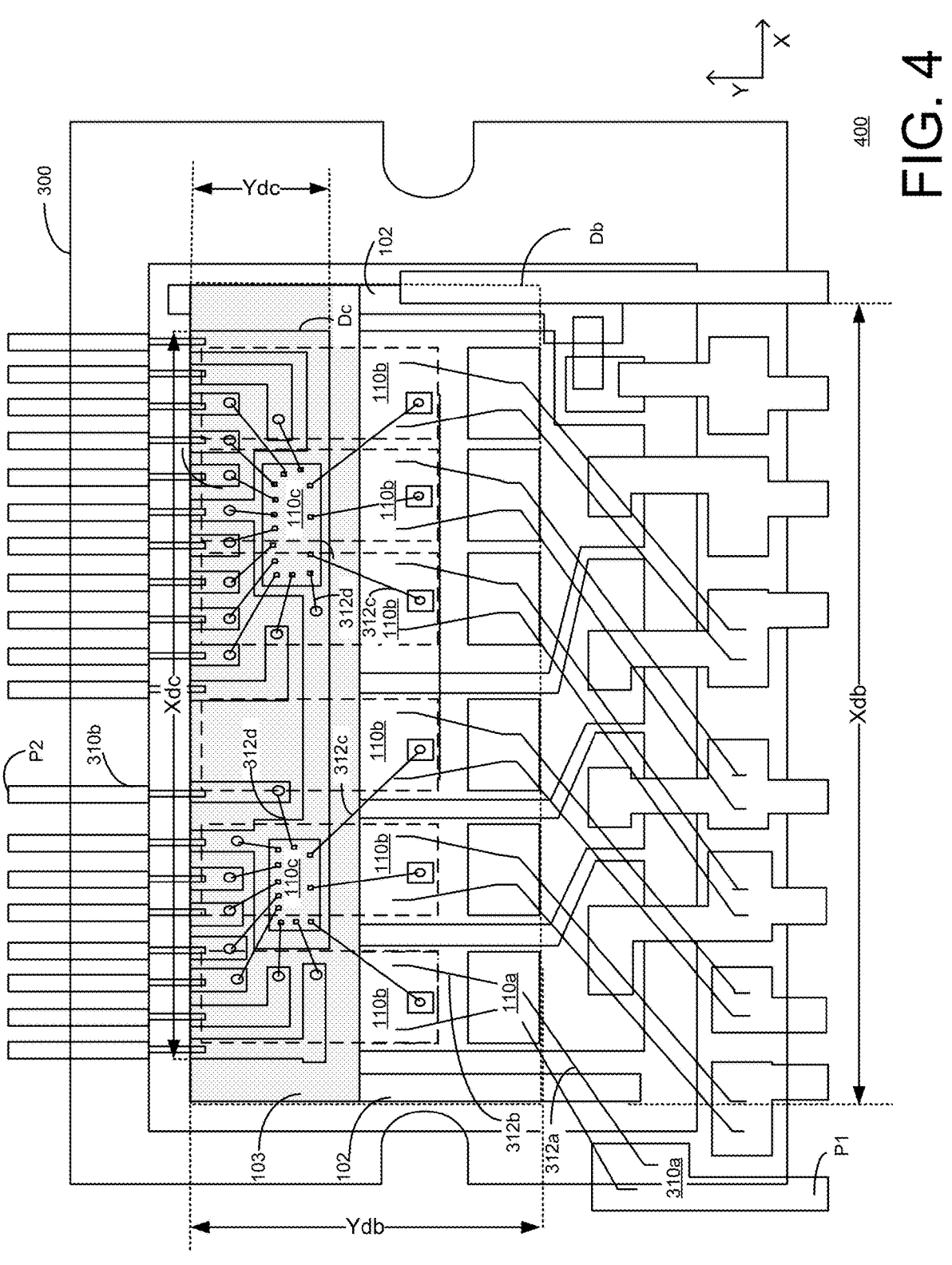
FIG. 4 illustrates an example two-dimensional (2-D) layout of the components of an example MCM device package.

In example implementations, a top surface 102t of DBM substrate 102 may be patterned to have designated areas (e.g., die attach pad Db.)) to which semiconductor die can be attached. In example implementations, die attach pad Db on DBM substrate 102 may have a length Xdb (in the x direction) and a width Ydb (e.g., width Ydb in the y direction as shown in FIG. 4), respectively. In example implementations, as shown in FIG. 1, the second DBM substrate (e.g., DBM substrate 103 having a length X2) may overhang or extend (e.g., in a negative x direction) over at least a portion of die attach pad Db (having length Xdb).

FIG. 1 shows, for example, semiconductor die 110a and semiconductor die 110b attached to die attach pad Db with an adhesive material 111 (e.g., a solder or a sinter). Semiconductor die 110a and semiconductor die 110b may, for example, be power devices (e.g., IGBTs, FRDs) or any other type of device. Semiconductor die 110b (e.g., an IGBT) and adhesive material 111 placed on die attach pad Db may have a combined height h2 (in the z direction) that is less than the height h1 between the first DBM substrate and the overhanging second DBM substrate (in other words, semiconductor die 110b and adhesive material 111 may have a height clearance of (h1−h2) in gap G below the overhanging second DBM substrate). Semiconductor die 110b may have a size (e.g., a large size in the x direction) so that a portion or section (e.g., section S1) of semiconductor die 110b on the first DBM substrate may lie underneath (i.e., vertically below) the overhanging second DBM substrate in gap G. Another portion or section (e.g., section S2) of semiconductor die 110*b* on the first DBM substrate may extend outside gap G in the −x direction beyond the length X2 of the overhanging second DBM substrate (in other words, section S2 does not have the overhanging second DBM substrate directly above it and extends outside gap G in the −x direction).

Semiconductor die 110*a* and section S2 of semiconductor die 110*b* on the first DBM substrate that are not underneath the overhanging second DBM substrate may present top surfaces with connection pads (not shown) that are accessible from above by wire bonding tools for wire bonding the dies (i.e., accessible from above in the z direction) without physical interference of the overhanging second DBM substrate.

Furthermore, a top surface 103*t* of DBM substrate 103 may be patterned to have at least one designated area (i.e., die attach pad Dc)) to which a semiconductor die (e.g., an IC die) can be attached. In example implementations, die attach pad Dc may have a length Xdc (in the x-direction) and a width Ydc (not shown in FIG. 1) in the Y direction (perpendicular to the page of FIG. 1).

The layers of vertical stack 100, viewed from the bottom up in the z direction (along axis Z1–Z1) in FIG. 1, include DBM substrate 102 with top surface 102*t*, a gap G of height h1, and DBM substrate 103 with top surface 103*t*. The layers of vertical stack 100, viewed from the bottom up in the z direction (along axis Z2–Z2) in FIG. 1, include DBM substrate 102 with top surface 102*t*, adhesive material 111, section S1 of semiconductor die 110*b* placed on top surface 102*t* of DBM substrate 102 in gap G underneath DBM substrate 103, DBM substrate 103, and semiconductor die 110*c* placed on top surface 103*t* of DBM substrate 103. The layers of vertical stack 100, viewed from the bottom up in the z direction (along axis Z3–Z3) in FIG. 1, include DBM substrate 102 with top surface 102*t*, adhesive material 111, section S2 of semiconductor die 110*b* placed on top surface 102*t* of DBM substrate 102 outside gap G underneath DBM substrate 103.

Figure 2A:
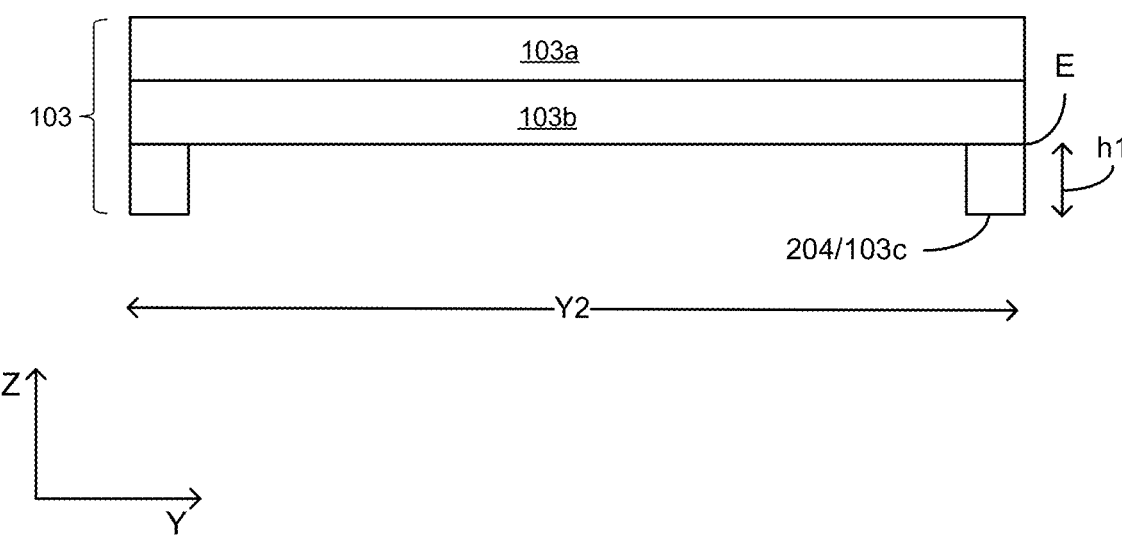
FIG. 2A illustrates a cross sectional view of a DBM substrate with portions of a metal sheet removed to form a spacer layer along edges of the DBM substrate.
Figure 2B:
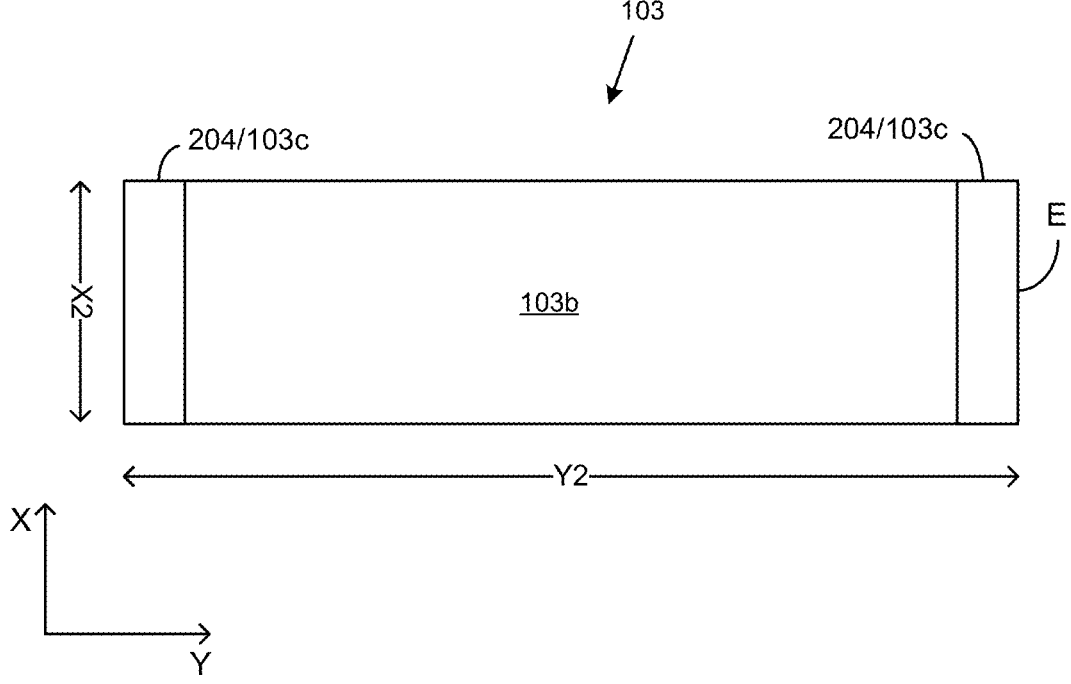
FIG. 2B illustrates a bottom view of the DBM substrate of FIG. 2A.

In some example implementations, portions of the planar sheet of metal (e.g., metal sheet 103*c*) bonded to the bottom surface of the second DBM substrate (DBM substrate 103) may be patterned and removed (etched) so that the remaining (unetched) portions of metal sheet 103*c* form (or are included in) the spacer layer (e.g., spacer layer 204) that supports the overhanging second DBM substrate above the first DBM substrate. FIG. 2A shows a cross sectional view (in the Y-Z plane) of DBM substrate 103 with portions of metal sheet 103*c* removed to form spacer layer 204 having a thickness or height h1 along edges E of the second DBM substrate. DBM substrate 103, which has a length X2 in the X direction (FIG. 1), may have a width Y2 in the y direction. FIG. 2B shows a bottom view (in the X-Y plane) of DBM substrate 103 with portions or metal sheet 103*c* removed to form spacer layer 204 along edges (e.g., edge E) of the second DBM substrate.

FIG. 3A is a cross-sectional view of an example MCM device package 300 in which multiple semiconductor die are disposed on a vertical stack of substrates (e.g., vertical stack 100), in accordance with the principles of the present disclosure.

MCM device package 300 may, for example, include multiple semiconductor dies (e.g., semiconductor die 110*a*, semiconductor die 110*b*, and semiconductor die 110*c*) disposed on a vertical stack of DBM substrates (e.g., vertical stack 100) encapsulated in a molding compound (e.g., molding compound 320). Semiconductor die 110*a* and semiconductor die 110*b* may, for example, be disposed on a die attach pad (e.g., DAP Db, FIG. 1) on DBM substrate 102. Semiconductor die 110*a* may be disposed on DBM substrate 102 such that a portion or section (e.g., section 51) of the die is vertically underneath DBM substrate 103 while another portion or section (e.g., section S2) of the die does not have DBM substrate 103 vertically above it (i.e., above section S2).

Furthermore, semiconductor die 110*c* may, for example, be disposed on a die attach pad (e.g., DAP Dc, FIG. 1) on DBM substrate 103 that is disposed above (i.e., in the z direction) semiconductor die 100*b* in vertical stack 100. The semiconductor dies and the DBM substrates may be encapsulated in a molding compound (e.g., molding compound 320). Molding compound 320 may, for example, be an insulating resin, epoxy, or other molding compound.

In MCM device package 300, leadframes (e.g., a leadframe 310*a* and a lead frame 310*b*) may, for example, provide external connections (e.g., pins P1 and P2) to the circuits in the package. In the example shown in FIG. 3A, leadframe 310*a* is attached to DBM substrate 102 and leadframe 310*b* is attached to DBM substrate 103 using a conductive adhesive material (e.g., solder 311). The semiconductor dies (e.g., semiconductor die 110*a*, semiconductor die 110*b* and semiconductor die 110*c*) in the package may be electrically interconnected to each other, to traces on the DBM substrates (e.g., DBM substrate 103), and to the leadframes (e.g., leadframe 310*a*) using wire bonds (e.g., wire bonds 312*a*, 312*b*, 312*c* and 312*d*, etc.). These wire bonds may be made of aluminum, gold, copper, or other metal or metal alloy wires.

In the example shown in FIG. 3A, semiconductor die 110*a* disposed on DBM substrate 102 is connected, for example, by wire bond 312*a* to leadframe 310*a* and by wire bond 312*b* to semiconductor die 110*b* disposed on DBM substrate 102. Semiconductor die 110*b* disposed on DBM substrate 102 is connected, for example, by wire bond 312*c* to semiconductor die 110*c* disposed on DBM substrate 103 that extends (in the negative x direction) above semiconductor die 110*b*/DBM substrate 102. Further, for example, semiconductor die 110*c* disposed on DBM substrate 103 is connected by wire bond 312*d* to traces (e.g., metal sheet 103*a*, FIG. 1) on DBM substrate 103.

Figure 3B:
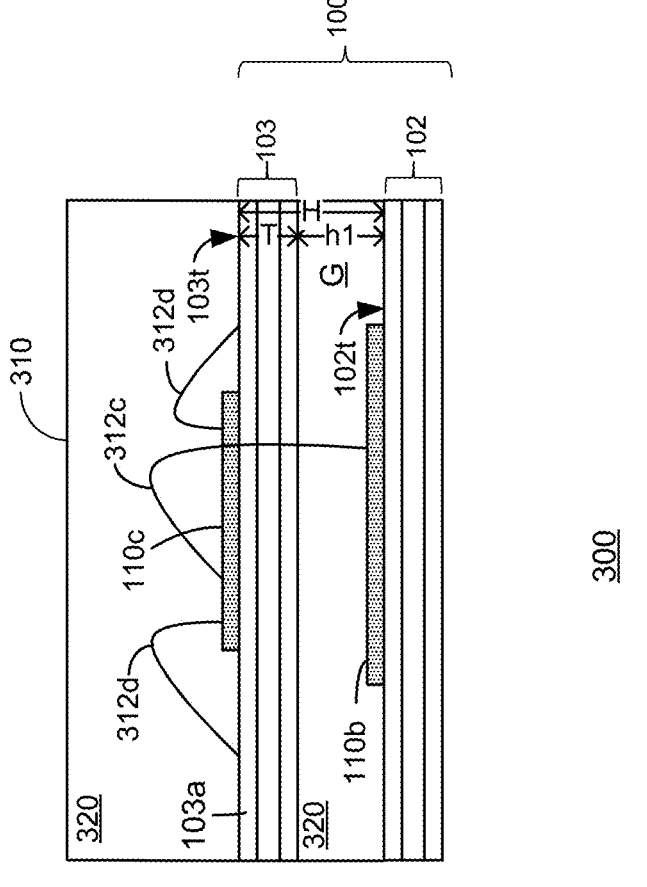

FIG. 3B illustrates example wire bonds between components at different heights in MCM device package 300. FIG. 3B shows a cross-sectional view of a portion of MCM device package 300 in the Z-Y plane along line A-A shown in FIG. 3A. As shown in FIG. 3B, semiconductor die 110*c* is disposed on top surface 103*t* of DBM substrate 103 that is at a height H above top surface 102*t* of DBM substrate 102. Height H may, for example, correspond to a sum of thickness T of the second DBM substrate 103 and the height h1 of gap G between the two substrates. A wire bond (e.g., wire bond 312*c*) interconnects semiconductor die 110*c* disposed on top surface 103*t* of second DBM substrate 103 at height H to semiconductor die 110*c* disposed at a lower height (−H) on top surface 102*t* of second DBM substrate 103. Further, wire bonds (e.g., wire bond 312*d*) interconnect semiconductor die 110*c* disposed on top surface 103*t* at height H to traces or pads (not shown) at the same height H in metal sheet 103*a* of second DBM substrate 103.

The semiconductor dies, the DBM substrates, the wire bonds, and portions or the lead frames attached to the semiconductor dies may be encapsulated, for example, in an insulating resin or epoxy (or other molding compound) (e.g., molding compound) forming a mold body 310 of MCM device package 300. A size of MCM device package 300 may be determined by the dimensions of mold body 310. As shown in FIG. 3A, mold body 310 may, for example, have a height H (e.g., in the z direction) and a length L in the x direction). These package dimensions may be selected so that the configuration of pins, leadframes, connectors, etc., (e.g., pin P1 and pin P2) in the package can be used to couple MCM device package 300 to a circuit board or other system components for a user application. MCM device package 300 may have standardized package size dimensions (e.g., height H and a length L) and dimensional tolerances for coupling MCM device package 300 to the circuit board or other system components of the user application.

FIG. 4 shows an example two-dimensional (2-D) layout 400 of the components of example MCM device package 300 in an X-Y plane. Layout 400 shows the disposition of DBM substrate 103 above DBM substrate 102, the disposition of semiconductor device dies (e.g., die 110a and die 110b) on DBM substrate 102, and the disposition of semiconductor device die (e.g., die 101c) on DBM substrate 103 above die 110b and DBM substrate 102 in MCM device package 300. Layout 400 also shows the disposition of the different wire bonds (e.g., wire bonds 312a, 312b, 312c and 312d, etc.) between package components that may be disposed at different vertical heights in the package.

In example implementations, as mentioned previously, DBM substrate 102 and DBM substrate 103 may, for example, have X and Y dimensions, each in a range of few millimeters to tens of millimeters. In the example layout 400 of MCM device package 300 shown in the FIG. 4, DBM substrate 102 may have X-Y dimensions of about 18 mm×30 mm. and DBM substrate 103 that is disposed above DBM substrate 102 may have X-Y dimensions of about 5 mm×30 mm.

An example die attach pad (e.g., DAP Db) disposed on an example DBM substrate 102 may have a length Xdb of about 29.8 mm (in the x direction) and a width Ydb of about 14 mm (in the y direction). A die attach pad (e.g., DAP Dc) disposed on DBM substrate 103 Dc may have smaller X-Y dimensions (e.g., a smaller width Ydc) than the DAP Db disposed on DBM substrate 102. For example, die attach pad (e.g., DAP Dc) disposed on DBM substrate 103 have a length Xdc of about 29.8 mm (in the X direction) and a width Ydc of about 6 mm (in the Y direction). A total die attach pad area available in the vertical stack of substrates (DBM substrate 102 and DBM substrate 103) may be the sum of the individual die attach pad areas (e.g., DAP Db and DAP Dc) available on individual DBM substrate 102 and individual DBM substrate 103.

In the example implementation shown in FIG. 4, up to six pairs of dies 110a and 110b may be attached to the die attach pad (e.g., DAP Db) on DBM substrate 102. Dies 110a and 110b may be power device die such as IGBTs and FRDs. Each die 110b (e.g., an IGBT) may, for example, have dimensions of about 3.4 μm×8.25 μm. Further, two dies (e.g., IC controller chips, die 110c) may be disposed on the die attach pad (e.g., DAP Dc) on DBM substrate 103. Each die 110c (e.g., an IC controller chip) may, for example, have dimensions of about 4 μm×2 μm.

Layout 400 also shows the disposition of the different wire bonds (e.g., wire bonds 312a, 312b, 312c and 312d, etc.) between components of the package. For example, wire bonds 312a connect die 110a to leadframes (e.g., leadframe 310a having pins P1); wire bonds 312b connect die 110a to die 110b; wire bonds 312c connect dies 110b to die 110c; wire bonds 312d connect die 110c to traces on DBM substrate 103 and to leadframes (e.g., leadframe 310b having pins P2);

In an example implementations, the example MCM device package 300 with the six IGBTs dies 110b (e.g., dies 110b) configured in a power circuit with two IC controller chips (e.g., dies 110c) as shown in layout 400 can have a total current capacity of about 75 A.

FIG. 5 illustrates an example method 500 for fabricating a multi-chip module (e.g., MCM device package 300, FIG. 3A) including multiple device die, in accordance with the principles of the present disclosure. The MCM or device package can be of any type and may have standardized dimensions and tolerances. In example implementations, the MCM or device package may, for example, be of a device package type registered, for example, with trade industry associations such as JEDEC and Pro Electron, or with other trade entities.

Method 500 utilizes a stack of two or more DBM substrates (e.g., vertical stack 100) to increase the die attach pad (DAP) area for attaching the multiple device die beyond the DAP area that may be available on a single DBM substrate in a standardized size MCM. In example implementations, the multiple device die may include power devices (e.g., IGBTs, FRDs, etc.) and integrated circuit (IC) controller devices. Using the stacked DBM substrates in a device package that has standardized dimensions increases the die attach pad area available in the package over the die attach pad area available with the use of only a single DBM substrate in the device package with standardized dimensions.

Method 500 may include attaching (i.e., bonding) at least one power device die (e.g., die 110a, and die 110b) to a first DBM substrate (e.g., DBM substrate 102) (510), and disposing a second DBM substrate at height h1 above the first DBM substrate (520).

The first DBM substrate may have a length and a width (e.g., in a x-y plane). The second DBM substrate may, for example, be a strip of DBM material having about a same length as the first DBM substrate but a smaller width than the first DBM substrate.

The second DBM substrate can form an overhang (e.g., a shelf) at a vertical height h1 above the first DBM substrate resulting in a gap (e.g., gap G) of height h1 between the first DBM substrate and the overhanging second DBM substrate.

Method 500 further includes attaching (e.g., soldering) leadframes (e.g., leadframe 310a, leadframe 310b) to the first DBM substrate and the second DBM substrate (530), and disposing (e.g., attaching) an IC die (e.g., die 110c) on the second DBM substrate at height h1 above the first DBM substrate (540).

Disposing the second DBM substrate at height h1 above the first DBM substrate 540 may include disposing a spacer layer having a height h1 on an edge of the second DBM substrate. In example implementations, the spacer layer may be made of adhesive material (e.g., a solder, a resin, an epoxy, a metal block, or a molding compound, etc.). In some example implementations, the second DBM substrate (e.g., the spacer layer) may be soldered to the first DBM substrate.

Method 500 further includes forming electrical interconnections between components of the MCM device package (550).

In example implementations, making electrical interconnections between components of the MCM device package 550 may include making wire bonds between the components of the MCM device package. The wire bonds may be made using, for example, aluminum, copper, gold, or other metal alloy wires. Making the electrical interconnections may, for example, include making wire bonds (e.g., Al wire bonds) interconnecting a first of the at least one power device die disposed on the first DBM substrate to the leadframe, and to a second of the at least one power device die disposed on the first DBM substrate. Further, making the electrical interconnections may include making a wire bond (e.g., an Al wire bond) interconnecting the second of the at least one power device disposed on the first DBM substrate to the IC die disposed on the second DBM substrate at height h1 above the first DBM substrate, and making wire bonds (e.g., a gold/copper wire bond) interconnecting the IC die to traces on second DBM substrate and to a lead frame attached to the second DBM substrate.

In some example implementations, making the electrical interconnections may, for example, include using a direct lead attach (DLA) or a conductive clip to interconnect one or more of components of the package. For example, copper connector clips may be used to interconnect the first of the at least one power device die disposed on the first DBM substrate to the leadframe, and/or to the second of the at least one power device die disposed on the first DBM substrate.

Method 500 further includes encapsulating the components of the MCM device package in a resin or an epoxy (e.g., an Epoxy Molding Compound (ECM)) (560).

FIGS. 6A through 6F show top views of MCM device package 300 (FIG. 3) at different stages of construction on a substrate (e.g., substrate 102), for example, after the different steps of method 500.

Figure 6A:
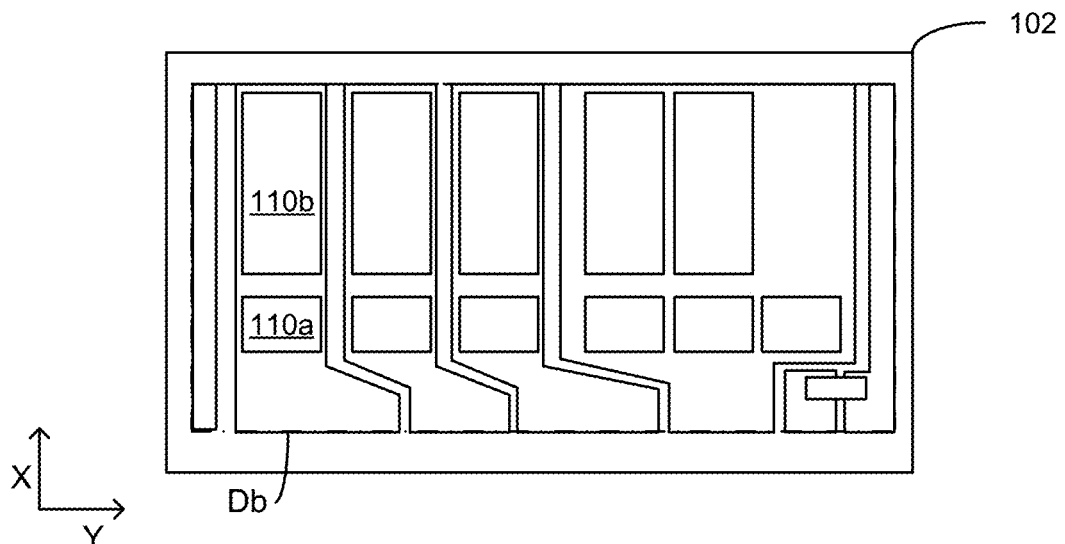
FIGS. 6A through 6F illustrate top views of an example MCM device package at various stages of construction.

FIG. 6A shows a first DBM substrate (e.g., DBM 102) on which the MCM device package is constructed. For example, six pairs of power device dies (e.g., dies 110a and dies 110b) are attached to the die attach pad Db on DBM 102. Dies 110a may, for example, be FRD device dies, and dies 110b may, for example, be IGBT device dies. The dies may be attached to DAP DB, for example, by soldering at step 510 of method 500.

Figure 6B:
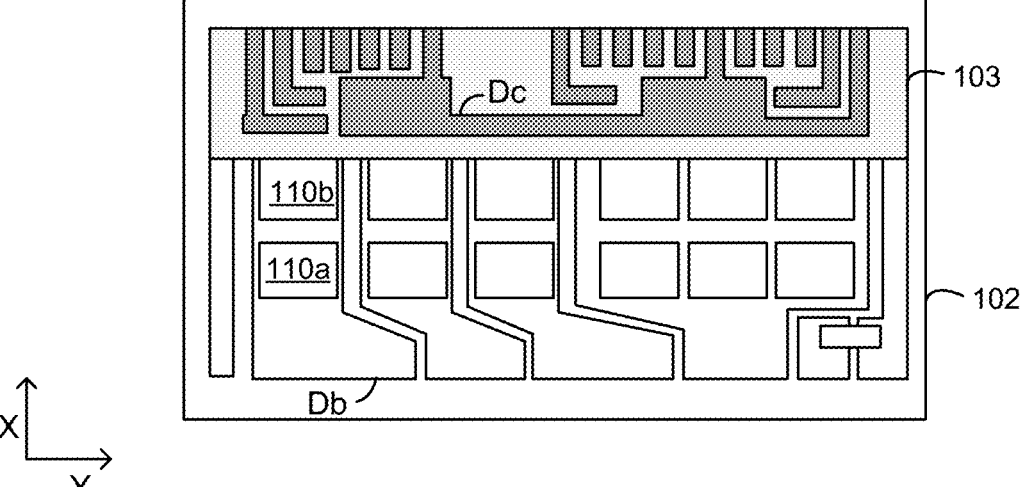

FIG. 6B shows a second DBM substrate (e.g., DBM 103) (a strip of DBM substrate) disposed above the first DBM substrate (e.g., DBM 102). DBM 103 may be disposed, i.e., stacked, at a height h1 (FIG. 1) above DBM 102, for example, at step 520 of method 500.

Figure 6C:
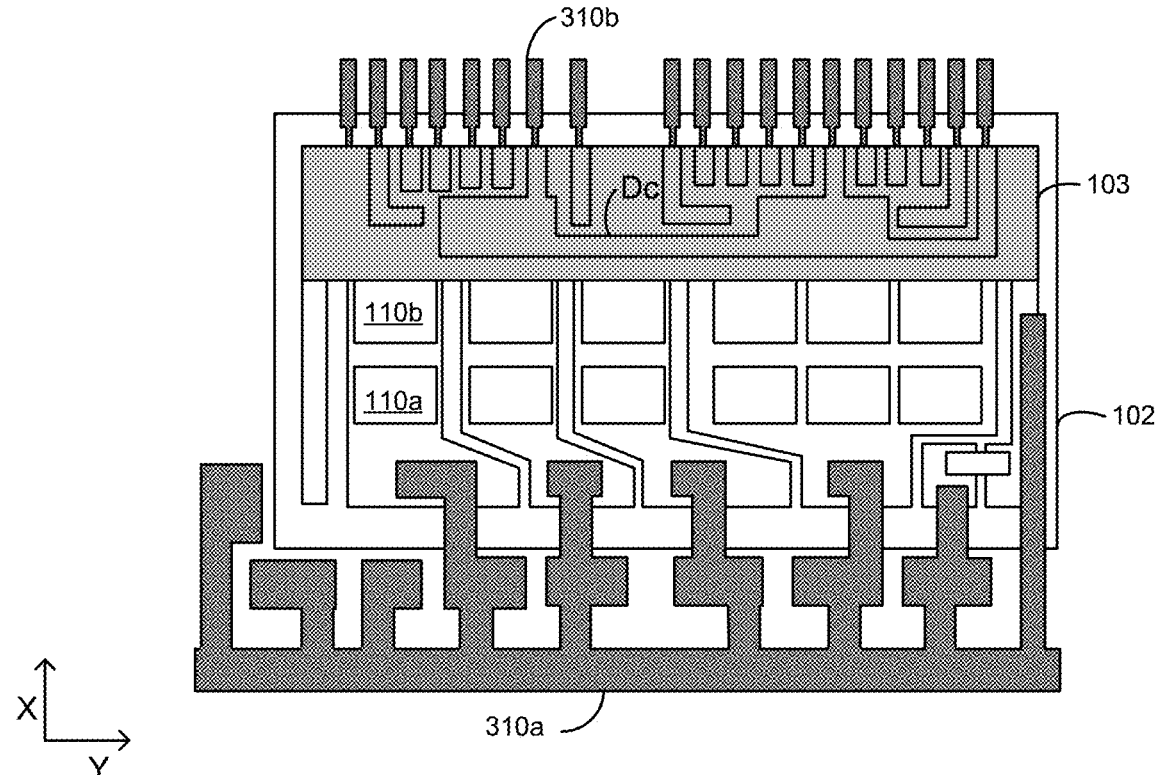

FIG. 6C shows leadframe 310a and leadframe 310b attached (e.g., soldered) to first DBM substrate and the second DBM substrate, respectively, for example, at step 530 of method 500.

Figure 6D:
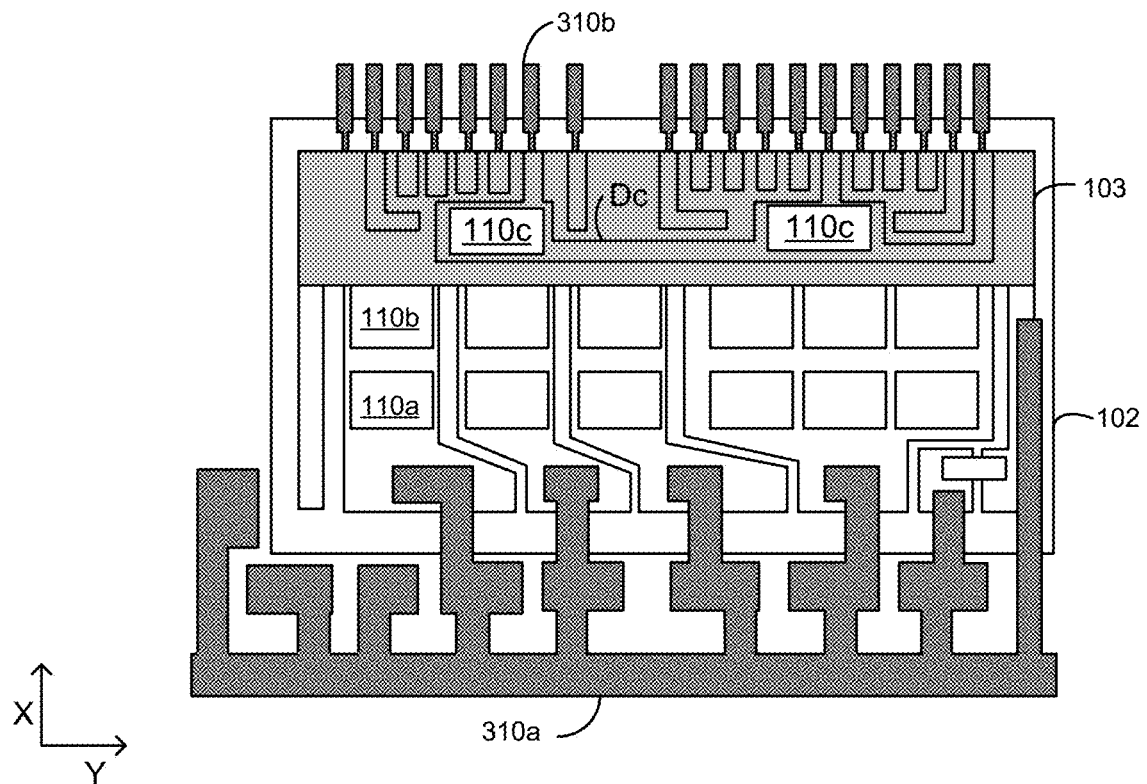

FIG. 6D shows IC dies (e.g., die 110c) disposed on the second DBM substrate at height h1 (FIG. 1) above the first DBM substrate. In the example shown, two IC dies 100c are disposed (e.g., soldered) on die attach pad Dc of the second DBM substrate, for example, at step 540 of method 500.

Figure 6E:
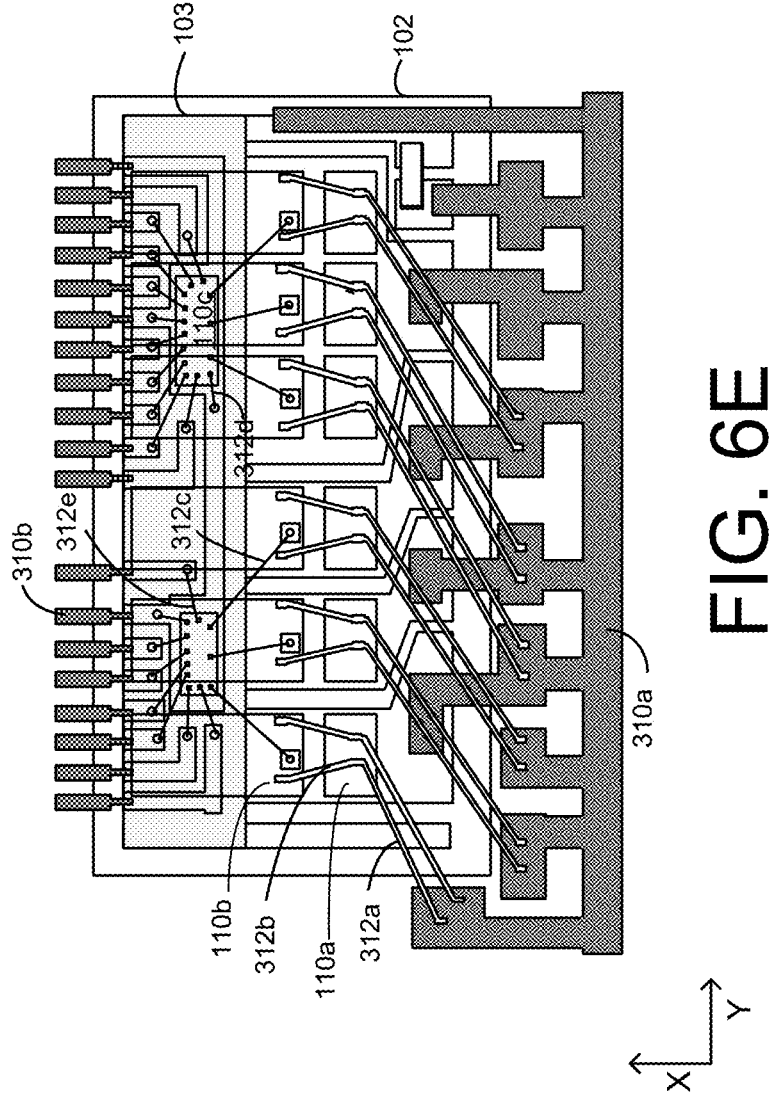

FIG. 6E shows electrical interconnections (e.g., wire bonds) (as also shown in FIG. 4) formed between components in the package, for example, after step 550 of method 500. For example, FIG. 6E shows wire bonds 312a between die 110a and leadframe 310a, wire bonds 312b between die 110a and die 110b; wire bonds 312c between die 110b and IC die 110c, wire bonds 312d between IC die 110c and traces on substrate 103, and wire bonds 312e between IC die 110c and leadframe 310b.

Figure 6F:
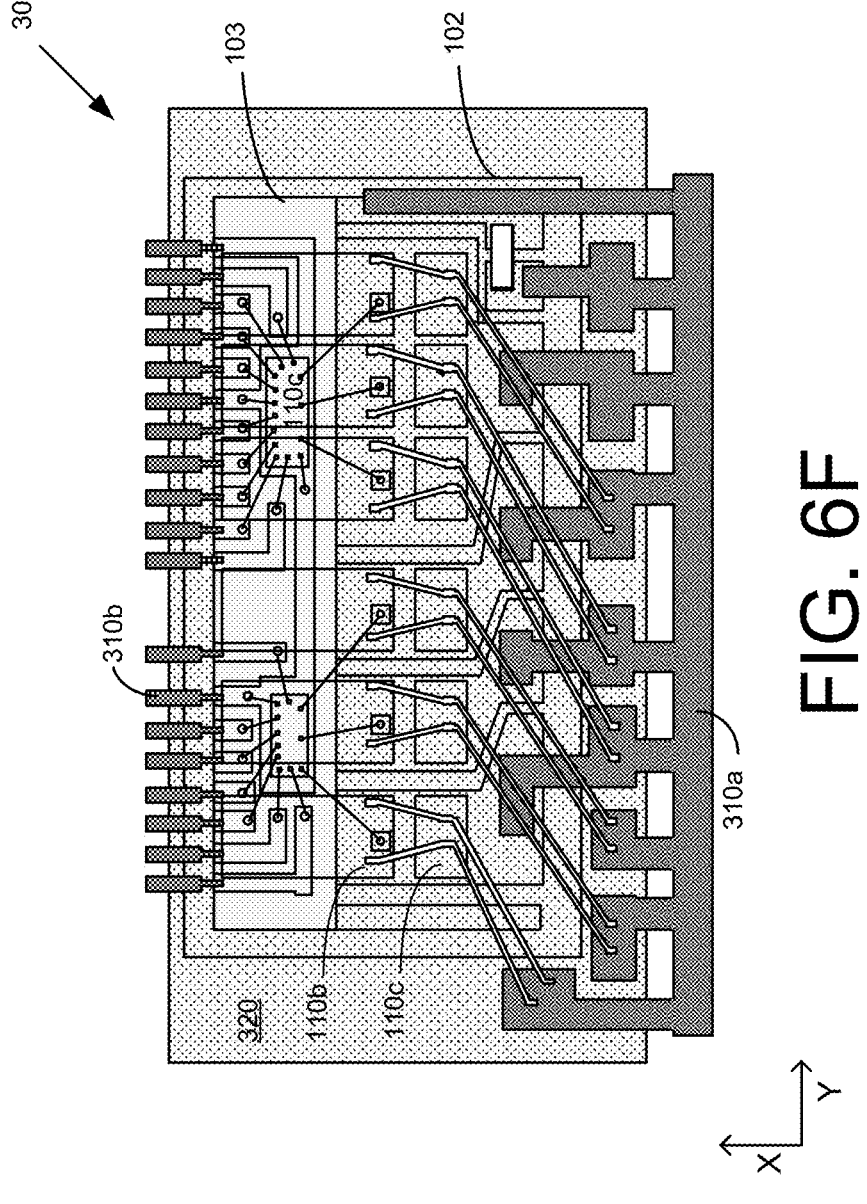

All components of the package are encapsulated in a molding compound 320 (e.g., at step 560 of method 500). FIG. 6F schematically illustrates the encapsulation of the stacked DBM substrates (i.e., the first DBM substrate (substrate 102) and the second DBM substrate (substrate 103)), all the dies (dies 110a, dies 110b, IC die 110c), and all the electrical interconnections between the dies, and all the electrical interconnections between the dies and the lead frames (leadframe 310a and leadframe 310b) in a molding compound 320. This encapsulation (e.g., at step 560 of method 500) to completes fabrication of MCM device package 300.

FIG. 7 illustrates an example method 700 for fabricating a multi-chip module (e.g., MCM device package 300, FIG. 3A) including multiple device die, in accordance with the principles of the present disclosure.

Method 700 includes disposing a first device die on a top surface of a first direct bonded metal (DBM) substrate (710), disposing a second DBM substrate above the first DBM substrate (720), disposing a second device die on a top surface of the second DBM substrate disposed above the first DBM substrate (730), and forming a wire bond between the first device die disposed on the top surface of the first DBM substrate and the second device die disposed on the top surface of the second DBM substrate (740).

Method 700 may further include encapsulating the first DBM substrate and the first device die, the second DBM substrate and the second device die, and the wire bond between first semiconductor die and the second device die in a mold body (750).

In method 700, disposing a second DBM substrate above the first DBM substrate 720 includes forming a spacer layer at an edge of the second DBM substrate to support the second DBM substrate above the first DBM substrate. Forming the spacer layer at the edge of the second DBM substrate may include removing a portion of a metal sheet bonded to a side of a ceramic tile of the second DBM substrate.

Method 700 may further include attaching a first leadframe to the first DBM substrate, and a second leadframe to the second DBM substrate.

In method 700, the second DBM substrate may form a shelf extending above a portion of the first device die and the first DBM substrate. The method may further include disposing a third device die on a portion of the first DBM substrate that is not underneath (in other words, not directly below) the shelf formed by the second DBM substrate.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques.

Some implementations may be implemented using several types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A package comprising:
a first direct bonded metal (DBM) substrate;
a first semiconductor die disposed on a top surface of the first DBM substrate;
a second DBM substrate disposed above the first DBM substrate such that a section of the first semiconductor die is disposed between the first DBM substrate and the second DBM substrate, the second DBM substrate having a spacer layer formed along an edge and supporting the second DBM substrate above the first DBM substrate;
a second semiconductor die disposed on a top surface of the second DBM substrate; and
a wire bond between the first semiconductor die disposed on the top surface of the first DBM substrate and the second semiconductor die disposed on the top surface of the second DBM substrate.

2. The package of claim 1, wherein the section of the first semiconductor die disposed between the first DBM substrate is a first section, the first semiconductor die includes a second section not disposed underneath the second DBM substrate, and the wire bond is between the second section of the first semiconductor die disposed on the top surface of the first DBM substrate and the second semiconductor die disposed on the top surface of the second DBM substrate.

3. The package of claim 1, wherein the first DBM substrate and the first semiconductor die, the second DBM substrate and the second semiconductor die, and the wire bond between first semiconductor die and the second semiconductor die are encapsulated in a mold body.

4. The package of claim 1, wherein the second DBM substrate forms a shelf extending above a portion of the first semiconductor die and the first DBM substrate.

5. The package of claim 4, further comprising, a third semiconductor die disposed on a portion of the first DBM substrate that is not below the shelf formed by the second DBM substrate.

6. The package of claim 1, further comprising:
a first lead frame attached to a trace on the first DBM substrate; and
a second lead frame attached to a trace on the second DBM substrate.

7. The package of claim 1, wherein the first semiconductor die is an insulated-gate bipolar transistor (IGBT) die and the second semiconductor die is an integrated circuit (IC) controller die.

8. A package comprising:
a stack of direct bonded metal (DBM) substrates including at least a first DBM substrate and a second DBM substrate disposed above the first DBM substrate;
a multiplicity of semiconductor die disposed on the stack of the DBM substrates including a first semiconductor die disposed on the first DBM substrate and a second semiconductor die disposed on the second DBM substrate, the second DBM substrate having a spacer layer formed along an edge and supporting the second DBM substrate above the first DBM substrate;
an insulating adhesive layer disposed between the first DBM substrate and the second DBM substrate and between the first semiconductor die and the second DBM substrate, a portion of first semiconductor die being encapsulated in the insulating adhesive layer; and
a wire bond between the first semiconductor die disposed on the first DBM substrate and the second semiconductor die disposed on the second DBM substrate.

9. The package of claim 8, further comprising:
a wire bond between the second semiconductor die disposed on the second DBM substrate and a trace on the second DBM substrate.

10. The package of claim 8, further comprising:
a first lead frame attached to a trace on the first DBM substrate; and
a second lead frame attached to a trace on the second DBM substrate.

11. The package of claim 8, further comprising:
a third semiconductor die disposed on the first DBM substrate; and
a wire bond between the first semiconductor die and the third semiconductor die disposed on the first DBM substrate.

12. The package of claim 11, further comprising:
a wire bond between the third semiconductor die disposed on the first DBM substrate and a lead frame of the package.

13. The package of claim 11, wherein the first semiconductor die, and third semiconductor die are power device dies, and the second semiconductor die is an integrated circuit (IC) controller die.

14. A method comprising:
disposing a first device die on a top surface of a first direct bonded metal (DBM) substrate;
disposing a second DBM substrate above the first DBM substrate such that a first section of the first device die is disposed between the first DBM substrate and the second DBM substrate and a second section of the first device die is not disposed below the second DBM substrate, the second DBM substrate having a spacer layer formed along an edge and supporting the second DBM substrate above the first DBM substrate;
disposing a second device die on a top surface of the second DBM substrate disposed above the first DBM substrate; and
forming a wire bond between the first device die disposed on the top surface of the first DBM substrate and the second device die disposed on the top surface of the second DBM substrate.

15. The method of claim 14, wherein forming the spacer layer at the edge of the second DBM substrate includes forming a cavity in a bottom metal layer of the second DBM substrate by removing a portion of the bottom metal layer, and the first device die is located within the cavity.

16. The method of claim 14, further comprising:
encapsulating the first DBM substrate and the first device die, the second DBM substrate and the second device die, and the wire bond between first semiconductor die and the second device die in a mold body.

17. The method of claim 14, further comprising:
attaching a first leadframe to the first DBM substrate; and
attaching a second leadframe to the second DBM substrate.

18. The method of claim 14, wherein the second DBM substrate forms a ledge extending above a portion of the first device die and the first DBM substrate, and the method further comprises dispose a third device die on a portion of the first DBM substrate that is not below the ledge formed by the second DBM substrate.

19. The method of claim 14, wherein the first device die is an insulated-gate bipolar transistor (IGBT) die and the second device die is an integrated circuit (IC) controller die.

* * * * *